(12) United States Patent
Wallrafen

(10) Patent No.: US 9,564,789 B2
(45) Date of Patent: Feb. 7, 2017

(54) ASSEMBLY HAVING A SUBSTRATE, AN SMD COMPONENT, AND A LEAD FRAME PART

(75) Inventor: Werner Wallrafen, Hofheim (DE)

(73) Assignee: Continental Automotive GmbH, Hannover (DE)

( * ) Notice: Subject to any disclaimer, the term of this patent is extended or adjusted under 35 U.S.C. 154(b) by 602 days.

(21) Appl. No.: 14/004,086

(22) PCT Filed: Mar. 7, 2012

(86) PCT No.: PCT/EP2012/053887
§ 371 (c)(1),
(2), (4) Date: Sep. 9, 2013

(87) PCT Pub. No.: WO2012/120032
PCT Pub. Date: Sep. 13, 2012

(65) Prior Publication Data
US 2014/0001897 A1    Jan. 2, 2014

(30) Foreign Application Priority Data
Mar. 9, 2011   (DE) .................. 10 2011 013 449

(51) Int. Cl.
*H02K 11/00* (2016.01)
*H02K 5/22* (2006.01)
(Continued)

(52) U.S. Cl.
CPC ............ *H02K 11/0094* (2013.01); *H01G 2/06* (2013.01); *H01G 4/248* (2013.01); *H02K 5/225* (2013.01);
(Continued)

(58) Field of Classification Search
CPC ........................... H02K 5/225; H02K 11/0094
See application file for complete search history.

(56) References Cited

U.S. PATENT DOCUMENTS 4,384,223 A    5/1983  Zelt
4,594,524 A *  6/1986  Sudo .................. H02K 29/08
                                                310/184
(Continued)

FOREIGN PATENT DOCUMENTS

| CN | 1084585 | 5/2002 |
| CN | 1783665 | 6/2006 |

(Continued)

OTHER PUBLICATIONS

AN 0018 Issue 1 "EMI Suppression for CD Motors using X2Y Integrated Passive Components"; Syfer Technology Limited, Aminghall, Norwich NR14 8SQ England; pp. 1 to 2, Apr. 29, 2005.

(Continued)

*Primary Examiner* — Dang Le
(74) *Attorney, Agent, or Firm* — Cozen O'Connor

(57) ABSTRACT

An assembly, having a substrate made of an electrically insulating material, an SMD component, which has lateral contact surfaces, and a lead frame part made of metal, which is fastened to the substrate and is used to establish electrical connections between the lateral contact surfaces of the SMD component and further functional elements of the assembly, wherein the lead frame part has contact tongues, which resiliently lie against the lateral contact surfaces and are connected to the lateral contact surfaces in a bonded manner.

18 Claims, 7 Drawing Sheets

(51) Int. Cl.
*H05K 1/18* (2006.01)
*H05K 3/32* (2006.01)
*H01G 2/06* (2006.01)
*H01G 4/248* (2006.01)

(52) U.S. Cl.
CPC .............. *H05K 1/183* (2013.01); *H05K 3/326* (2013.01); *H05K 2201/0311* (2013.01); *H05K 2201/0397* (2013.01); *H05K 2201/09118* (2013.01); *H05K 2201/1006* (2013.01); *H05K 2201/10636* (2013.01); *Y02P 70/611* (2015.11)

(56) References Cited

U.S. PATENT DOCUMENTS

| | | | |
|---|---|---|---|
| 5,994,648 A * | 11/1999 | Glovatsky | H05K 1/183 174/254 |
| 6,271,607 B1 * | 8/2001 | Vandenbossche | H01L 25/16 257/E25.029 |
| 6,768,243 B1 * | 7/2004 | Yamazaki | H02K 5/145 310/239 |
| 6,903,920 B1 | 6/2005 | Prymak | |
| 2002/0047471 A1 | 4/2002 | Sik Lau | |
| 2002/0047749 A1 | 4/2002 | Sugawara | |
| 2004/0033724 A1 | 2/2004 | Felgueroso et al. | |
| 2005/0239331 A1 | 10/2005 | Bourdykina | |
| 2006/0022329 A1 | 2/2006 | Jordan | |

FOREIGN PATENT DOCUMENTS

| | | |
|---|---|---|
| DE | 3641353 | 6/1988 |
| DE | 199 10 838 | 9/2000 |
| DE | 101 29 118 | 12/2002 |
| DE | 10 2005 038 813 | 6/2006 |
| EP | 1624550 | 1/2007 |
| EP | 1 659 837 B1 | 11/2007 |
| GB | 2 416 928 | 2/2006 |
| JP | 01-290287 | 11/1989 |
| JP | 5-109575 | 4/1993 |
| JP | 09-205264 | 8/1997 |
| JP | 9-289365 | 11/1997 |
| JP | 10-321987 | 12/1998 |
| JP | 2000-133897 | 5/2000 |
| JP | 2002-134873 | 5/2002 |
| JP | 2002-270991 | 9/2002 |
| JP | 2011-029313 | 2/2011 |
| WO | WO 98/44769 | 10/1998 |
| WO | WO 01/09354 | 5/2001 |

OTHER PUBLICATIONS

"DC Motor Design with X2Y(R) Technology"; X2Y Attenuators, LLC; Erie, Pennsylvania, pp. 1 to 17.

* cited by examiner

ASSEMBLY HAVING A SUBSTRATE, AN SMD COMPONENT, AND A LEAD FRAME PART

CROSS REFERENCE TO RELATED APPLICATIONS

This is a U.S. national stage of application No. PCT/EP2012/053887, filed on Mar. 7, 2012. Priority is claimed on German Application No. DE102011013449.2, filed Mar. 9, 2011, the content of which is incorporated herein by reference.

BACKGROUND OF THE INVENTION

1. Field of the Invention

The invention relates to an assembly comprising a substrate embodied from an electrically insulating material, an SMD component, which has lateral contact surfaces, and a stamped lead frame part embodied from metal, which stamped lead frame part is fastened to the substrate and is used to establish electrical connections between the lateral contact surfaces of the SMD component and further functional elements of the assembly.

2. Description of the Prior Art

SMD components (SMD: surface mounted device) differ from wired electronic components in that they are compact and it is possible to fit them in a simple manner. They are attached to circuit boards or ceramic substrates and soldered to the conductor tracks on the circuit boards. The conductor tracks are then connected to further electrical connections, in particular by way of connection cables or connection wires. In the event that only a few SMD components are required for a particular assembly, this type of mounting is extremely labor-intensive and expensive and it requires a large amount of installation space. EMC-filters for improving the electromagnetic compatibility (EMC) of direct current electric motors are one example. In the case of applications of this type, it is extremely labor-intensive to establish a contact between the conductor tracks of the circuit board and/or a ceramic substrate and further current-carrying components and a lot of space is required in regions in which very little installation space is available.

It is known from the US patent U.S. Pat. No. 6,903,920 B1 to protect an SMD ceramic condenser from mechanical loadings, in that said condenser is fastened to a circuit board with metal sockets. The sockets are embodied from copper strips that are curved in the shape of a U and one end thereof is soldered to the lateral contact surfaces of the SMD ceramic condenser.

This connection is made prior to the condenser being mounted on a circuit board. The free ends of the sockets are subsequently soldered to the conductor tracks on the circuit board.

A holder for an EMC filter is known from the publication GB 2 416 928 A. The EMC filter comprises an arrangement of ceramic condensers in an SMD housing having four lateral contact surfaces. The holder comprises a receiving device for the filter, said receiving device being surrounded by four walls. A spring clamp is placed on each of the walls surrounding the receiving device. One end of the spring clamp contacts the lateral contact surfaces of the filter, which end lies inside the receiving device. The outer lying ends are connected by way of further contact sites.

It is also known to connect SMD ceramic condensers without a separate circuit board or a ceramic substrate directly to a so-called lead frame, which is a stamped lead frame part embodied from metal. In particular, it is possible to solder the condensers directly to the lead frame. This connecting technique causes high mechanical loadings on the ceramic condenser and these loadings can cause damage or destruction of the condensers as a result of different coefficients of thermal expansion particularly in the case of simultaneous temperature fluctuations in an operating temperature range for example from −50° C. to +160° C.

SUMMARY OF THE INVENTION

An object of the invention is to provide an assembly whose components can be produced in a cost-effective manner and assembled in a simple manner and used in a robust and reliable manner even under high mechanical and thermal loadings.

The assembly has:
  a substrate embodied from an electrically insulating material;
  an SMD component that comprises lateral contact surfaces; and
  a stamped frame part embodied from metal and fastened to the substrate used to establish electrical connections between the lateral contact surfaces of the SMD component and further functional elements of the assembly, wherein
  the stamped lead frame part comprises contact tongues that lie in a resilient manner against the lateral contact surfaces and are connected by a positive material connection to the lateral contact surfaces.

The SMD component is arranged in a predefined position relative to the substrate. The SMD component can, for example, lie against an upper face of the substrate or it can be placed at a distance therefrom.

The stamped lead frame part is embodied from metal, in particular from copper or an alloy that contains copper. The material of the stamped lead frame part comprises resilient properties and the contact tongues are likewise resilient. The stamped lead frame part can be produced by being stamped out of a suitable metal sheet and it can comprise a plurality of contact tongues that can be stamped out in a single working step. Parts that have been stamped out simultaneously can be subsequently separated from each other to separate each of the stamped lead frame parts into a plurality of components that are not electrically connected to each other. Alternatively, the stamped lead frame part can be embodied from a plurality of stamped parts in their combination, which stamped parts comprise in each case only one contact tongue.

The stamped lead frame part is fixed to the substrate, in other words it is fixed in its arrangement relative to the substrate. The stamped lead frame part is used to produce electrical connections to further functional elements of the assembly. The functional elements can be, for example, further electronic components or electromechanical components of the assembly. Brush holders of an electric motor are one example. The stamped lead frame part can establish the electrical connection to the further functional elements by a direct electrical contact, in other words without a separate electrical connecting element such as a cable or a wire. For example, the brushes of an electric motor can be connected directly to the stamped lead frame part or an electrical contact can be established by directly placing the brushes or a brush holder against said stamped lead frame part.

The stamped lead frame part can also be described as a lead frame.

The contact tongues can be embodied in one piece with the stamped lead frame part and in particular can be produced during the same stamping procedure as the further components of the stamped lead frame part. In addition, the contact tongues can be rendered thinner in further processing steps.

Alternatively, the contact tongues can also be manufactured separately and subsequently connected to the further components of the stamped lead frame part, for example by spot welding or soldering.

The contact tongues lie in a resilient manner against the lateral contact surfaces of the SMD component and are connected thereto in a positive material connection. The positive material connection can be achieved in particular by soldering or alternatively, for example, by conductive adhesives. The solder connection can be produced by tin-plating the contact surfaces and subsequently heating after the SMD component has been arranged on the substrate, for example in a reflow-soldering process.

Alternatively, the positive material connection can be produced by laser soldering, in other words using a laser beam to purposefully heat the elements that are to be connected. The positive material connection creates a particularly robust arrangement where the elements are contacted in a reliable manner and the electrical connections remain intact in particular in the presence of contamination, high levels of humidity or vibrations.

Generally, the resilient manner in which the contact tongues lie against the lateral contact surfaces itself establishes an electrical connection. This is permanently ensured by the additional positive material connection. The procedure of mounting the assembly can be simplified by virtue of the resilient contact arrangement owing to the fact that as a consequence the SMD component can be held in its mounted position in a resilient manner by the contact tongues and can remain in said position independently of any subsequent positive material connection. In particular, whilst establishing the positive material connection, it is not necessarily required to provide any additional fixing for the SMD component in the mounted position.

In one embodiment, the substrate comprises a depression that is formed in an upper face, the SMD component is arranged in said depression and the contact tongues protrude into said depression. Owing to the fact that the contact tongues of the stamped lead frame part protrude into the depression, said contact tongues lie at least in part, in particular with their free ends, inside the depression. The SMD component is arranged in the depression of the substrate, in other words it is located at least in part inside the depression. Said SMD component can be arranged completely in the depression or it can protrude upwards out of the depression and protrude beyond the upper face of the substrate. The lateral contact surfaces of the SMD component can be located at least in part inside the depression. The SMD component can be fastened in the depression, for example by being adhered to a base of the depression. Said SMD component can also be held in its position exclusively by the resilient contact tongues, particularly during the procedure of mounting the assembly.

In one embodiment, the substrate is produced using an injection molding process. Said substrate can be embodied, for example, from a thermosetting or thermoplastic synthetic material. The substrate can be produced in a cost-effect manner using an injection molding process and it is possible to provide the substrate with a complex shape. In particular, the depression can be embodied in the substrate during the process of injection molding the substrate.

In one embodiment, the substrate is connected to the stamped lead frame part during the injection molding process. The substrate can be injection molded onto the stamped lead frame part or parts of the stamped lead frame part can be extrusion-coated with the material of the substrate. This also renders possible a cost-effective production process and the stamped lead frame part is fixed to the substrate in a precise and permanent manner. In particular, the contact tongues of the stamped lead frame part can be positioned precisely in a predefined arrangement with respect to the depression.

The stamped lead frame part can also be fastened to the substrate in any other optional manner. In accordance with one embodiment, the stamped lead frame part is adhered to the substrate.

In one embodiment, the stamped lead frame part is fastened to the upper face of the substrate. It can in particular be connected to a surface that is located on the upper face of the substrate, for example, by adhering or by injection molding the substrate to the stamped lead frame part.

In one embodiment, the contact tongues protrude into the depression from the upper face. The contact tongues can protrude into the depression from any optional direction, for example through a lateral wall face of the depression in the case of a stamped lead frame part that is in part extrusion-coated with the material of the substrate. When the contact tongues protrude from the upper face, it is possible to insert the SMD component simply into the depression and the electrical contact between the contact tongues and the lateral contact surfaces of the SMD component can be established in a particularly simple and reliable manner. In particular, the contact tongues can guide the SMD component into the desired position as it is placed into the depression.

In one embodiment, the depression comprises a base and lateral wall faces and the contact tongues are arranged at a distance from the lateral wall faces. This arrangement enables the contact tongues to be displaced in a resilient manner in the direction towards these lateral wall faces. As a consequence, it is particularly easy to contact and/or hold the SMD component in a resilient manner and to easily compensate for manufacturing tolerances.

In one embodiment, the lateral wall faces are arranged in an inclined manner in the region of the contact tongues, so that an angle in the range from 95° to 140° is produced between a lateral wall face and an adjoining upper face. In other words, the depression widens in a funnel-like manner towards the upper face. This arrangement produces free space for the contact tongues and the process of inserting the SMD component can be further simplified.

In one embodiment, at least one contact tongue is arranged on at least two sides of the depression. The two sides can be opposite one another. Contact tongues can also be arranged on three or more sides of the depression. The depression can comprise in particular a rectangular cross-section (in a cross-section plane parallel to the upper face) and can comprise four sides that lie in pairs opposite one another. It is possible for the SMD component to contact a lateral contact surface of any of these sides. For example, it is possible to provide two contact tongues that are arranged on opposite sides of the depression. However, it is also possible to establish three or more contacts by selecting the number of contact tongues accordingly.

In one embodiment, the contact tongues comprise a portion that is curved around an edge of the depression and is arranged at a distance from the edge, from a lateral wall face of the depression and from the upper face of the substrate. The curved portion can be essentially in the shape of an arc of a circle and/or can be at a uniform distance from the elements of the substrate. The curvature provides good resilient properties of the contact tongues, if necessary even when using a relatively rigid material for the contact tongues. Furthermore, said curvature prevents the sensitive SMD components from becoming damaged.

In one embodiment, the material thickness of the contact tongues is less than the material thickness of the stamped lead frame part in a portion that is remote from the depression. The material thickness of the stamped lead frame part can be in the range from 0.3 mm to 1.2 mm, in particular in the range from 0.4 mm to 1 mm. The material thickness of the contact tongues can be in the range from 0.05 mm to 0.3 mm, in particular in the range from 0.1 mm to 0.2 mm. The material thickness can be reduced for example by rolling or pressing the contact tongues following the first stamping procedure and a further stamping procedure. In particular, the material thickness of one portion remote from the depression up to a linked and/or free portion of the contact tongues can be continuously reduced.

In one embodiment, the contact tongues are embodied in one piece with the stamped lead frame part by reshaping and cutting a stamped lead frame part. For example, following a first stamping procedure, the stamped lead frame part can be rolled or pressed in the region where the contact tongues are to be formed, as a consequence of which the material is thinner and wider. Subsequently, the contact tongues can be shaped into the desired form for example by a further stamping procedure or by cutting. In one embodiment, the SMD component and the contact tongues are encased by an encapsulation compound. The encapsulation compound can be for example a synthetic material, for example a polyester resin or an epoxy resin. The encapsulation compound can essentially completely fill the depression. Said encapsulation compound can encompass the SMD component on all sides. The encapsulation compound can also be arranged only in the region of the contact tongues and the lateral contact surfaces of the SMD component. The encapsulation compound can completely cover the SMD component, in particular including adjoining portions of the contact tongues and further free-lying portions of the stamped lead frame part that lie further outwards. In this manner, the SMD component and the connection to the contact tongues are also protected permanently from environmental influences. In particular, an extraordinarily robust structure is achieved in conjunction with the positive material connection between the contact tongues and the lateral contact surfaces.

In one embodiment, the SMD component is a ceramic condenser having four lateral contact surfaces, of which in each case two lie as a pair opposite one another. Ceramic condensers of this type are used as EMC filters and are also known under the term "X2Y" condensers. They comprise an arrangement of condenser elements that is particularly suitable for interference suppression and protection purposes and said condenser elements are integrated in a rectangular housing. Said condenser elements are sensitive to mechanical loadings and high levels of humidity and can be used with particular advantage in the manner in accordance with the invention. One embodiment of the invention is fundamentally suitable for any SMD components that have lateral contact surfaces, for example for conventional ceramic condensers that have only two opposite-lying lateral contact surfaces.

In one embodiment, the substrate is a housing part of an electric motor and the stamped lead frame part establishes the electrical connections of the electric motor. For example, the substrate can be an end cap of an electric motor that holds a receiving device for a bearing component or a shaft of the motor. The substrate is consequently not a separate component that is used exclusively for accommodating the SMD component.

BRIEF DESCRIPTION OF THE DRAWINGS

The invention is further explained hereinunder with reference to exemplary embodiments illustrated in seven figures, in which.

The same reference numerals are used for corresponding parts in all the figures.

DETAILED DESCRIPTION OF THE PRESENTLY PREFERRED EMBODIMENTS

Figure 1:
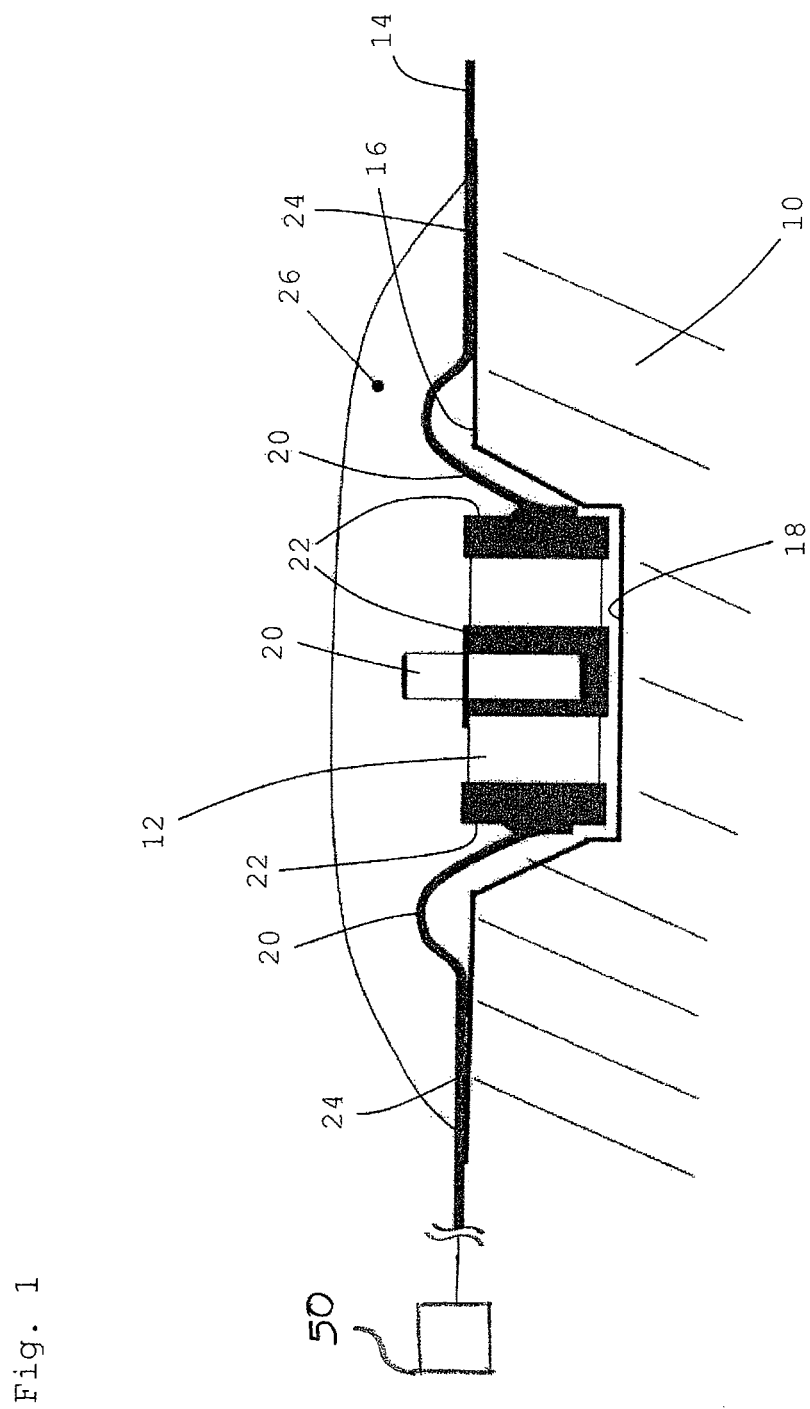
FIG. 1 is a cross-section of an assembly in accordance with one embodiment of the invention.

FIG. 1 illustrates an assembly in accordance with one embodiment of the invention having a substrate 10, an SMD component 12 and a stamped lead frame part 14 that is embodied from metal.

The substrate 10 is embodied from a thermoplastic synthetic material and is produced using an injection molding process. Said substrate has an upper face 16 and a depression 18 that is provided in the upper face 16.

The SMD component 12 is arranged in the depression 18. Said SMD component protrudes slightly beyond the upper face 16.

The stamped lead frame part 14 comprises four contact tongues 20, of which three are evident in the figure. The contact tongues 20 protrude with their respective free ends into the depression 18 and lie in a resilient manner against the lateral contact surfaces 22 of the SMD component 12. The free ends of the contact tongues 20 that are lying against the lateral contact surfaces 22 of the SMD component 12 are connected in a positive locking manner to the lateral contact surfaces 22 and in fact in the illustrated example by soldering.

In addition to comprising the contact tongues 20, the stamped lead frame part 14 comprises portions 24 that are remote from the contact tongues 20. These portions 24 define a plane and are adhered to the upper face 16 of the substrate 10.

The entire arrangement is covered with an encapsulation compound 26. This encases the SMD component 12 and fills the downwards-closed depression 18 completely. The contact tongues are also completely encompassed and covered by the encapsulation compound 26. The portions of the stamped lead frame part 14 that are remote from the contact tongues 20 are not covered by the encapsulation compound 26. Said portions are used to establish a connection to further functional elements of the assembly.

The SMD component 12 in the illustrated exemplary embodiment is a so-called X2Y ceramic condenser that is used as an EMC filter for an electric motor, in particular for a direct current electric motor having brushes. The substrate 10 is a part of an end cap of a housing of this electric motor. The portions 24 of the stamped lead frame part 14 that are remote from the contact tongues 20 and are illustrated on the right-hand side and the left-hand side in FIG. 1 are connected directly to the brush holders 50 of the electric motor. The two contact tongues 20 that are associated with these portions 24 that are illustrated on the right-hand side and the left-hand side are manufactured as one part with the stamped lead frame part 14 and lie against two opposite-lying lateral contact surfaces 22 of the SMD component 12. The two remaining lateral contact surfaces 22 of the SMD component 12 that are facing the observer on one side in the FIG. 1 and on the other side lie on the rear face of the arrangement are connected to ground by way of further contact tongues 20.

Further details regarding the depression 18 and the stamped lead frame part 14 are explained in detail with reference to FIG. 2 that illustrates the arrangement from FIG. 1 prior to inserting the SMD component 12. The depression 18 comprises a rectangular cross-section in a cross-section plane that extends parallel to the upper face 16 of the substrate 10. In a lower portion 28 of the depression 18, this cross-section does not change with the distance from the upper face 16 and the lateral wall faces 32 are arranged in this lower portion 28 in a perpendicular manner with respect to the base 32 of the depression 18.

The depression 18 comprises an upper portion 34 directly above the lower portion 28 and the lateral wall faces 30 are arranged in said upper portion in an inclined manner at an angle of approx. 120° with respect to the upper face 16. These inclined portions 36 of the lateral wall faces 30 extend towards the upper face 16 of the substrate where an edge 38 of the depression 18 is formed.

The material thickness $d_L$ of the stamped lead frame part 14 in its portions 24 that are remote from the contact tongues 20 is approx. 0.6 mm. This material thickness continuously reduces in the direction towards the contact tongues 20 until it achieves the material thickness $d_s$ in the region of the contact tongues 20, which material thickness amounts to approx. 0.2 mm.

The stamped lead frame part 14 achieves the material thickness $d_s$ at a distance from the edge 38 of the depression. At this point, the contact tongues are initially curved upwards and a curved portion 40 of the contact tongues 20 adjoins thereto, which curved portion 40 is curved substantially in the form of an arc of a circle about the edge 38 of the depression 18. Approximately at the end of this curved portion 40, the contact tongues 20 penetrate the plane of the upper face 16 and protrude downwards into the depression 18 and in fact approximately as far as the boundary between the lower portion 28 and the upper portion 34 of the depression 18. The curved portion 40 and the further progression of the contact tongues 20 as far as their free ends 42 maintain an almost uniform distance from the substrate 10. This distance is approx. 1 mm.

Figure 2:
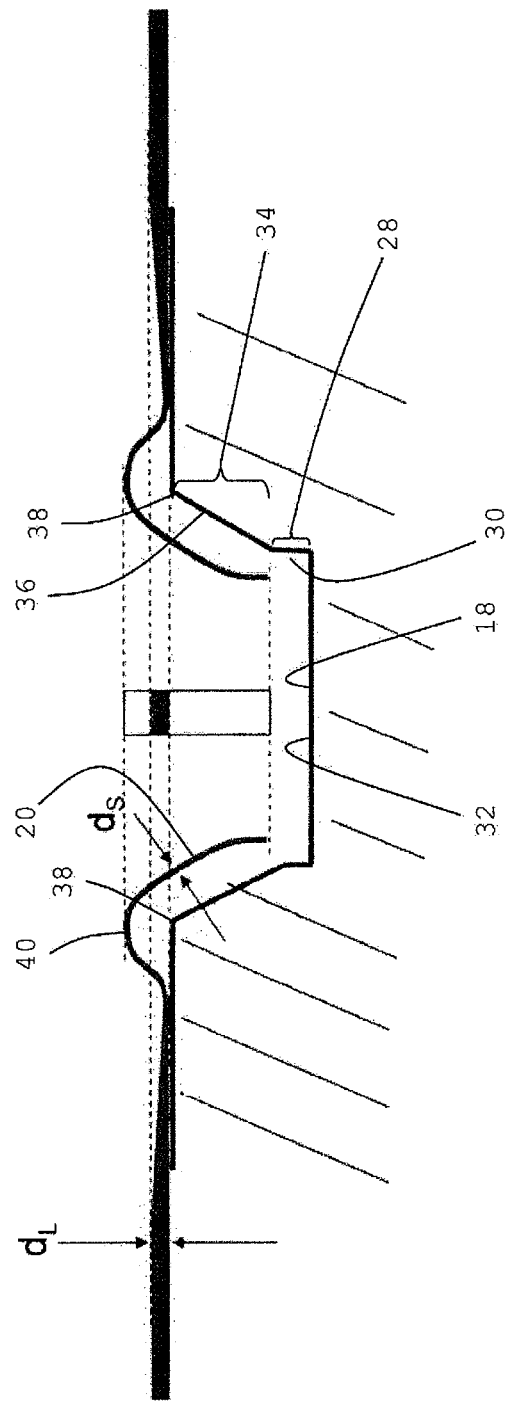
FIG. 2 is a substrate and stamped lead frame part with the contact tongues of the assembly from FIG. 1 prior to inserting an SMD component.
Figure 3:
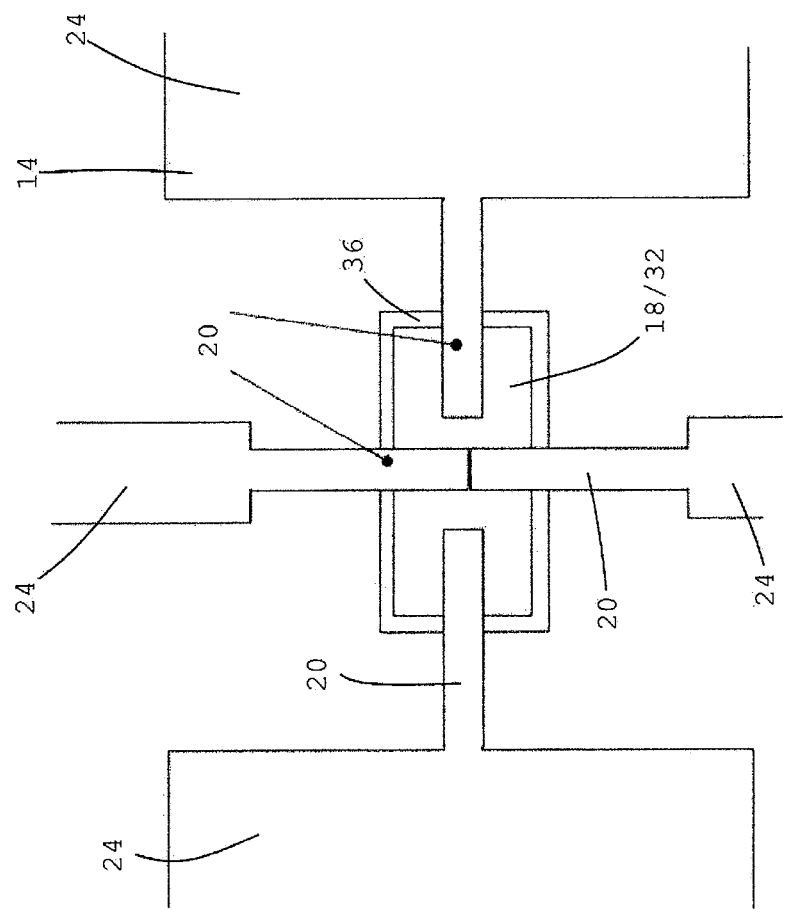
FIG. 3 is a view from above of the arrangement from FIG. 2 in a simplified representation prior to bending the contact tongues.

FIG. 3 illustrates the arrangement from FIG. 2 in a view from above. The upper face 16 of the substrate 10 is evident as is the stamped lead frame part 14 with its total four contact tongues 20 that protrude into the depression 18. The portions 24 of the stamped lead frame part 14 that are remote from the contact tongues 20 are connected in an electrical manner to further functional elements (not illustrated in the figure) of the assembly without further electrical connecting elements such as cables, or wires, or the like. The contact tongues 20 comprise a uniform width. This width is for example in the range from 0.6 mm to 2.0 mm.

Figure 4:
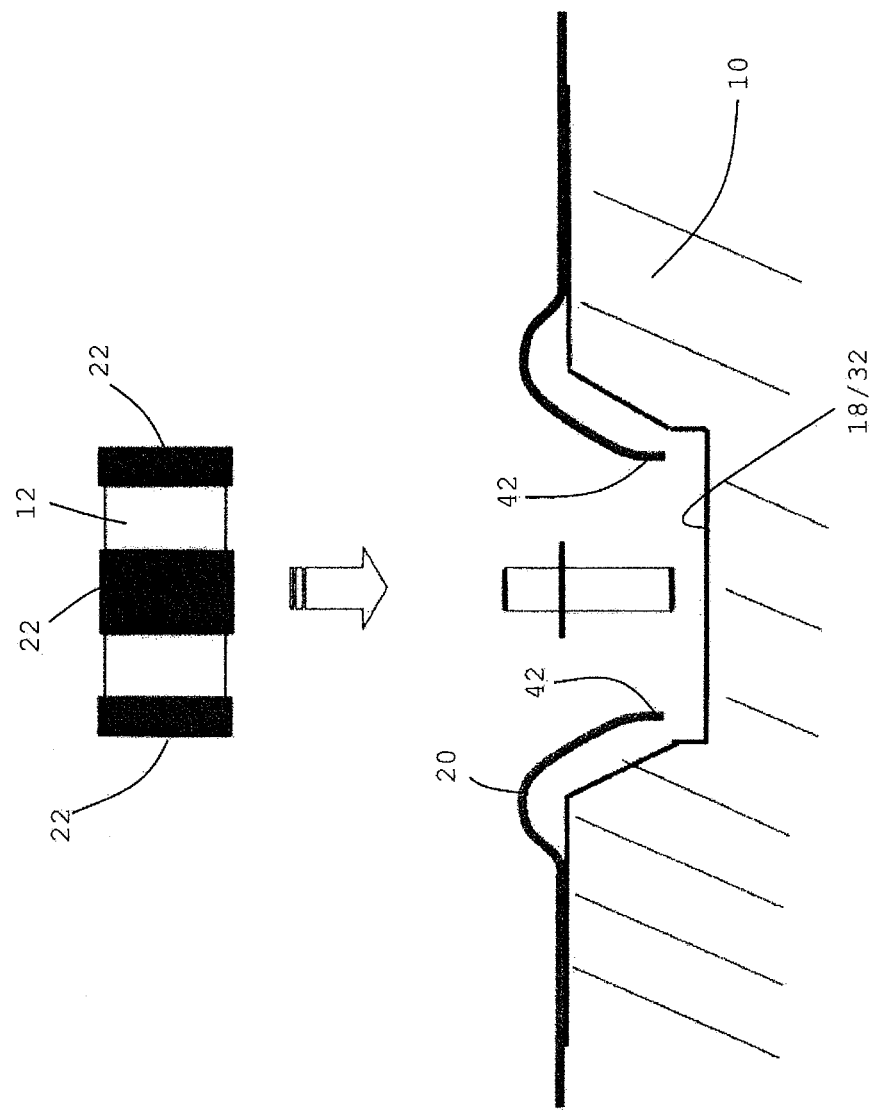
FIG. 4 is the procedure of inserting the SMD component into the arrangement illustrated in FIG. 2.

FIG. 4 illustrates the procedure for inserting the SMD component 12 into the depression 18 with the contact tongues 20. The lateral contact surfaces 22 of the SMD component 12 are likewise clearly evident.

The distance between the free ends 42 of the contact tongues 20 is somewhat less than the length of the SMD component 12 between the associated lateral contact surfaces 22. Consequently the free ends 42 of the contact tongues 20 lie in a resilient manner against the lateral contact surfaces 22. It is clearly evident that the free ends 42 of the contact tongues 20 maintain a distance from the base 32 of the depression 18. This arrangement protects them from becoming damaged if they are reshaped as the SMD component 12 is inserted into the depression 18.

FIG. 4 illustrates that the surfaces of the contact tongues 20, which surfaces are facing the SMD component 12, and the lateral contact surfaces 22 of the SMD component 12 are tin-plated so that they can be mutually connected in a positive material manner by being subsequently heated.

Figure 5:
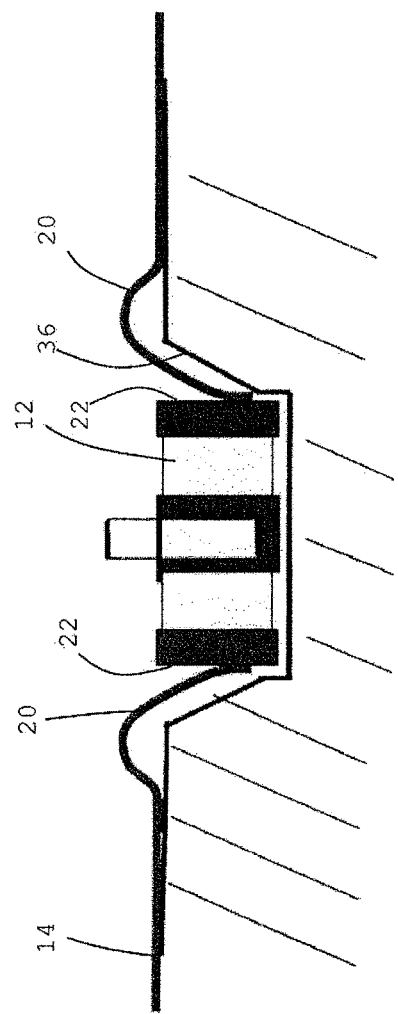
FIG. 5 is the arrangement from FIG. 2 with the SMD component inserted.

FIG. 5 illustrates the state of the assembly after the SMD component 12 has been inserted into the depression 18. It is evident that the contact tongues 20 lie in a resilient manner against the lateral contact surfaces 22 of the SMD component 12 and despite the fact that they have changed shape in the direction towards the lateral wall faces 30 said contact tongues maintain a distance from said lateral wall faces 30.

Figure 6:
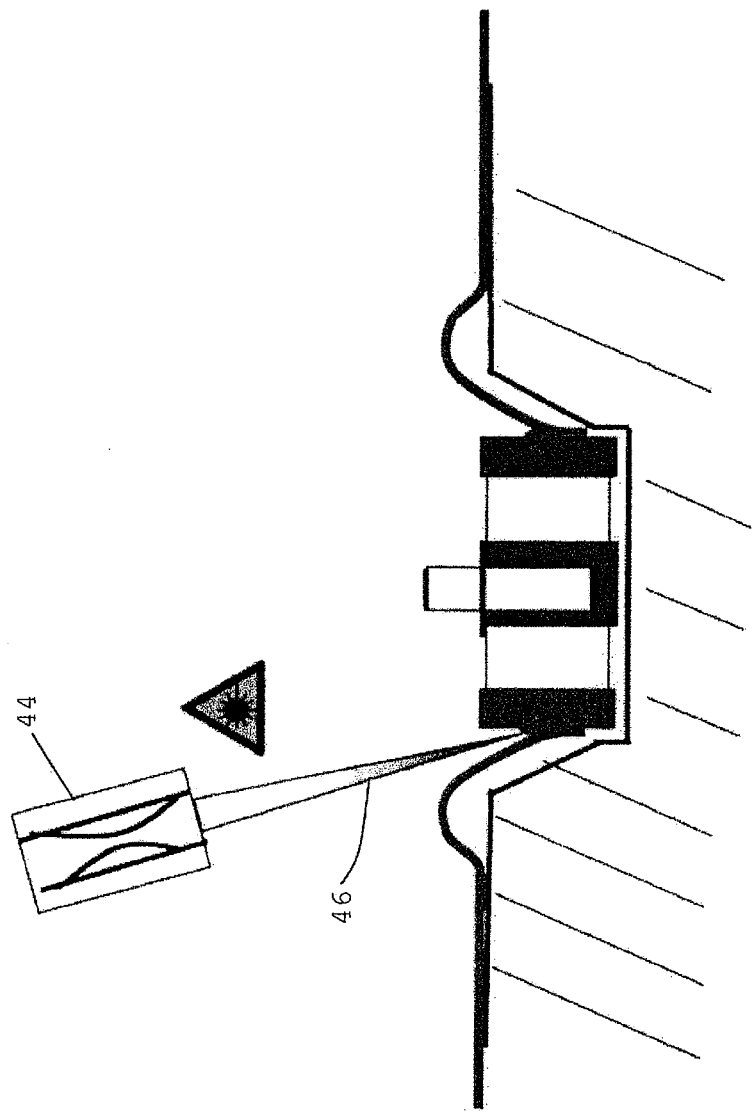
FIG. 6 is the positive locking connection being produced by means of laser soldering.

FIG. 6 illustrates how the soldering process can be performed. The figure provides a schematic illustration of a laser soldering device 44 that heats the contact region between the contact tongue 20 and the lateral contact surface 22 using a laser beam 46.

Alternatively, the surfaces that have been previously tin-plated are soldered in the reflow soldering process. This is illustrated schematically in FIG. 7, wherein the heating effect is indicated by the arrows 48.

Figure 7:
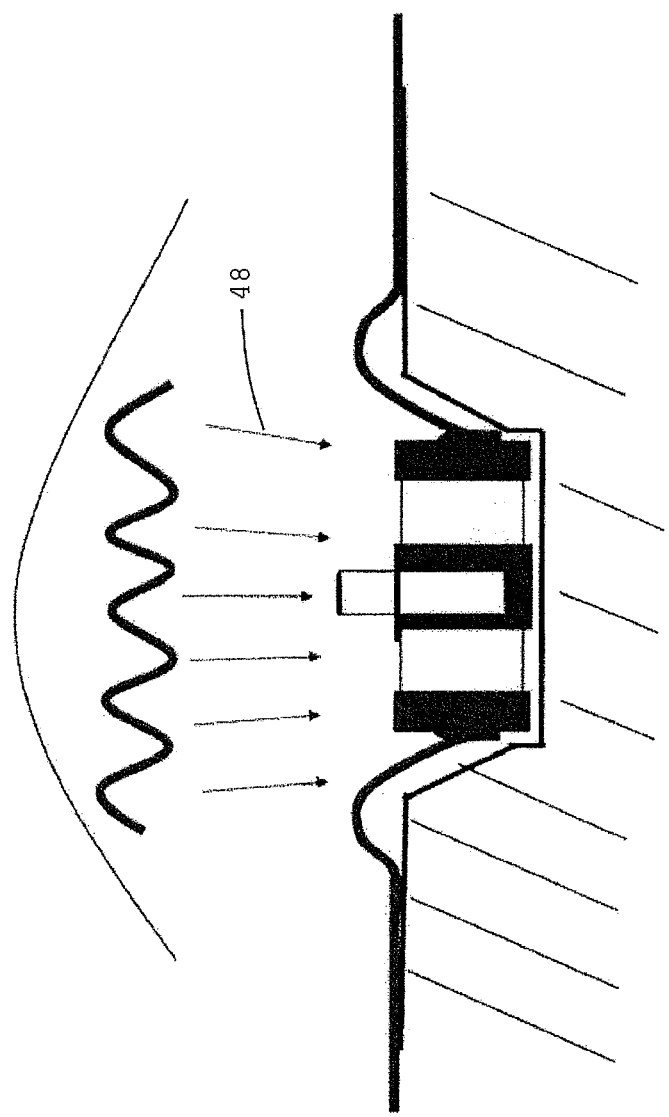
FIG. 7 is the positive locking connections being produced by means of reflow soldering.

An encapsulation compound 26 is applied following the completion of the soldering steps illustrated in FIG. 6 or 7 so that the end state that is illustrated in FIG. 1 is achieved.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An assembly comprising:
    a substrate embodied from an electrically insulating material having a depression formed in a face of the substrate;
    an SMD component arranged in the depression and having lateral contact surfaces; and
    a stamped lead frame part embodied from metal and fastened to the substrate, the stamped lead frame part configured to establish electrical connections between the lateral contact surfaces of the SMD component and further functional elements of the assembly, wherein the stamped lead frame part comprises contact tongues that lie in a resilient manner against the lateral contact surfaces and are connected by a positive material connection to the lateral contact surfaces, wherein the depression comprises a base and lateral wall faces that extend from the base towards the face, wherein the lateral wall faces are arranged in an inclined manner in the region of the contact tongues, so that an angle in a range from 95° to 140° is produced between a lateral wall face and an adjoining portion of the face defining free space for the contact tongues.

2. The assembly as claimed in claim 1, wherein the contact tongues protrude into the depression.

3. The assembly as claimed in claim 2, wherein the stamped lead frame part is fastened to the face of the substrate.

4. The assembly as claimed in claim 2, wherein the contact tongues protrude out from the face into the depression.

5. The assembly as claimed in claim 2, wherein the contact tongues are arranged at a distance from the lateral wall faces.

6. The assembly as claimed in claim 2, wherein at least one respective contact tongue is arranged on each of at least two sides of the depression.

7. The assembly as claimed in claim 2, wherein the contact tongues comprise a first portion that is curved around an edge of the depression and is arranged at a distance from each of:
the edge of the depression,
a lateral wall face of the depression, and
the face of the substrate.

8. The assembly as claimed in claim 2, wherein at least one respective contact tongue is arranged on each side of the depression.

9. The assembly as claimed in claim 1, wherein the substrate is produced in an injection molding process.

10. The assembly as claimed in claim 9, wherein the substrate is connected to the stamped lead frame part in the injection molding process.

11. The assembly as claimed in claim 1, wherein the stamped lead frame part is adhered to the substrate.

12. The assembly as claimed in claim 1, wherein the contact tongues are embodied in one piece with the stamped lead frame part by reshaping and cutting the stamped lead frame part.

13. The assembly as claimed in claim 1, further comprising an encapsulation compound that encases the SMD component and the contact tongues.

14. The assembly as claimed in claim 1, wherein SMD component is a ceramic condenser having four lateral contact surfaces, wherein each two lateral contact surfaces lie as a pair opposite one another.

15. The assembly as claimed in claim 1, wherein the substrate is a housing part of an electric motor and the stamped lead frame part establishes electrical connections of the electric motor.

16. The assembly as claimed in claim 15, wherein the housing part of the electric motor is a motor part end cap.

17. The assembly as claimed in claim 1, wherein the further functional elements of the assembly are brush holders.

18. An assembly comprising:
a substrate embodied from an electrically insulating material;
an SMD component having lateral contact surfaces; and
a stamped lead frame part embodied from metal and fastened to the substrate, the stamped lead frame part configured to establish electrical connections between the lateral contact surfaces of the SMD component and further functional elements of the assembly,
wherein the stamped lead frame part comprises contact tongues that lie in a resilient manner against the lateral contact surfaces and are connected by a positive material connection to the lateral contact surfaces,
wherein:
the substrate comprises a depression formed in a face of the substrate,
the SMD component is arranged in the depression, and the contact tongues protrude into the depression, and
wherein the contact tongues comprise a material thickness ($d_s$) that is less than a material thickness ($d_L$) of the stamped lead frame part in a portion that is remote from the depression.

* * * * *